(12) United States Patent
Sano et al.

(10) Patent No.: US 9,121,738 B2
(45) Date of Patent: Sep. 1, 2015

(54) MEASURING DEVICE OF AIR FLOW RATE FOR AIR CONDITIONING SYSTEM

(71) Applicant: HITACHI, LTD., Tokyo (JP)

(72) Inventors: Kentaro Sano, Hitachinaka (JP); Hayato Shimizu, Ryugasaki (JP)

(73) Assignee: Hitachi, Ltd., Tokyo (JP)

( * ) Notice: Subject to any disclaimer, the term of this patent is extended or adjusted under 35 U.S.C. 154(b) by 110 days.

(21) Appl. No.: 13/788,869

(22) Filed: Mar. 7, 2013

(65) Prior Publication Data

US 2013/0340535 A1 Dec. 26, 2013

(30) Foreign Application Priority Data

Jun. 25, 2012 (JP) ................. 2012-141871

(51) Int. Cl.

| | |
|---|---|
| *G01F 1/34* | (2006.01) |
| *F24F 11/04* | (2006.01) |
| *F24F 13/08* | (2006.01) |
| *H05K 7/20* | (2006.01) |
| *G01F 1/00* | (2006.01) |
| *G01F 1/36* | (2006.01) |
| *G01F 15/06* | (2006.01) |
| *G01F 1/40* | (2006.01) |
| *F24F 11/00* | (2006.01) |

(52) U.S. Cl.
CPC . *G01F 1/34* (2013.01); *F24F 11/04* (2013.01); *F24F 13/08* (2013.01); *G01F 1/00* (2013.01); *G01F 1/363* (2013.01); *G01F 15/063* (2013.01); *H05K 7/20745* (2013.01); *H05K 7/20836* (2013.01); *F24F 2011/0042* (2013.01); *F24F 2221/40* (2013.01); *G01F 1/40* (2013.01)

(58) Field of Classification Search
CPC ............... G01F 1/00; G01F 1/34; G01F 1/38; G01F 1/40; H05K 7/20745; H05K 7/20836; F24F 11/04; F24F 13/08; F24F 2221/40; F24F 2011/0042
USPC ............................................... 73/861, 861.42
See application file for complete search history.

(56) References Cited

U.S. PATENT DOCUMENTS

| | | | | |
|---|---|---|---|---|
| 5,707,005 A | * | 1/1998 | Kettler et al. | ............ 454/229 |
| 2002/0020446 A1 | * | 2/2002 | Federspiel | ................ 137/12 |

(Continued)

FOREIGN PATENT DOCUMENTS

| | | |
|---|---|---|
| EP | 2169328 A2 | 3/2010 |
| GB | 2480470 A | 11/2011 |

(Continued)

*Primary Examiner* — Lisa Caputo
*Assistant Examiner* — Philip Cotey
(74) *Attorney, Agent, or Firm* — Mattingly & Malur, PC (57) ABSTRACT

A measuring device of air flow rate for an air conditioning system which accurately measures the flow rate of cooling air blowing out of the openings of some rectangular units and in which the locations of the openings can be changed according to the location of equipment. The measuring system includes a plurality of panels constituting a floor surface, ceiling surface, or wall surface, a rectangular vent unit with openings located in place of a given one of the panels, a space with a given height formed by pillars on the back sides of the rectangular vent unit and the panels, and an air conditioner for supplying cooking air to the space. The cooling air from the space passes through the openings. A measuring means for measuring the flow rate of cooling air passing through the openings is located in a rib which forms the openings.

7 Claims, 9 Drawing Sheets

(56) References Cited

U.S. PATENT DOCUMENTS

| | | | |
|---|---|---|---|
| 2005/0267639 A1* | 12/2005 | Sharma et al. | 700/276 |
| 2006/0168975 A1* | 8/2006 | Malone et al. | 236/49.3 |
| 2008/0178947 A1* | 7/2008 | Spreitzer | 137/487 |
| 2009/0326721 A1* | 12/2009 | Sugiyama et al. | 700/299 |
| 2010/0027216 A1* | 2/2010 | Matsushima et al. | 361/679.49 |
| 2010/0064714 A1* | 3/2010 | Tashiro | 62/259.2 |
| 2012/0138259 A1* | 6/2012 | Carlson | 165/11.1 |
| 2013/0128450 A1* | 5/2013 | Redshaw et al. | 73/861.47 |

FOREIGN PATENT DOCUMENTS

| | | |
|---|---|---|
| JP | 07-208766 A | 8/1995 |
| JP | 07-333015 A | 12/1995 |
| JP | 2008-121911 A | 5/2008 |
| JP | 2011-211789 A | 10/2011 |
| WO | 01/75374 A1 | 10/2001 |

\* cited by examiner

MEASURING DEVICE OF AIR FLOW RATE FOR AIR CONDITIONING SYSTEM

CLAIM OF PRIORITY

The present application claims priority from Japanese application serial no. 2012-141871, filed on Jun. 25, 2012, the content of which is hereby incorporated by reference into this application.

FIELD OF THE INVENTION

The present invention relates to a measuring device of air flow rate for an air conditioning system which is installed in a datacenter.

BACKGROUND OF THE INVENTION

An example of the background art in this technical field is the technique disclosed in JP-A-H7 (1995)-208766. According to this technique, in a room of a datacenter which must be air-conditioned, the floor is a free access floor entirely covered by rectangular units of a prescribed size through which air cannot get in and out. The free access floor enables an air conditioning apparatus to supply cooling air for cooling IT equipment in the datacenter to the underfloor space of the free access floor. One or more than one of the rectangular units constituting the underfloor space is (are) replaced by a unit (units) with an opening so that cooling air is supplied to the room through the unit(s) with an opening.

This system may be used not only in a datacenter but also in a clean room which must be always ventilated and air-conditioned. Alternatively a ventilation space for supply air and exhaust air which is constituted by rectangular units and freely accessible may be provided on a ceiling or wall surface.

The above system, in which the ventilation space is constituted by rectangular units and ventilation is done through a unit with an opening, has a feature that the location of the opening can be adjusted according to the destination of ventilation air or the object which takes in the air for efficient air ventilation even after installation of the system.

Furthermore, JP-A-H7 (1995)-333015 describes a device for measuring the air-conditioned state of a freely accessible underfloor space which includes various sensors and measuring instruments mounted on the back surface of a free access floor member or a plate of the same size and made of almost the same material, in which these sensors and instruments are capable of measuring at least the flow direction, flow velocity, temperature, and humidity to measure an air-conditioned state and are integrated into a unit. According to this measuring device, an ordinary free access floor plate can be replaced by this plate so that the air-conditioned state under the free access floor can be measured for a desired time period.

Furthermore, JP-A-2008-121911 describes a measuring system which includes a measuring unit with a wireless transmitter, as a measuring device to measure the air-conditioned state under a free access floor easily. According to this system, at least three wireless receivers are provided in places and the location of the measuring unit is detected according to the intensities of signals received by the receivers.

In a datacenter, the cooling air generated by an air conditioning apparatus (hereinafter referred to as an air conditioner) is supplied to the space under the floor, the space above the ceiling or the space behind the wall. The supplied cooling air cools the equipment which generates heat, such as a server, storage and network (hereinafter referred to as equipment) and the room.

In a room as a datacenter like this, the floor, ceiling or wall is constituted by rectangular units. One or more than one of these rectangular units can be replaced by a unit (units) with an opening. As a consequence of such replacement, cooling air can be taken in or out through the newly installed unit(s) and the location of the opening can be changed according to the destination of ventilation air or the object which takes in the air so that air ventilation can be done efficiently.

In that case, it is necessary to accurately measure, at several points, the flow rate of cooling air supplied through the unit(s) with an opening to the room where the equipment is installed. A possible approach to measuring the air flow rate is to bring an air flow rate measuring device close to the opening and measure the air flow rate directly. This approach has a problem that it may be impossible to make a measurement accurately because the air flow rate measuring device may block the opening.

In the measuring device described in JP-A-H7 (1995)-333015, the measuring device is accessed through a unit with an opening and the opening pressure drop during measurement is different from that during normal operation, so the measurement of the air flow rate in a situation that the measuring device is not installed cannot be obtained.

Furthermore, the layout of the room may be changed at any time and the optimum location of a rectangular unit with an opening varies depending on the layout of the room. Therefore, when a wireless transmitter is provided as in the measuring device described in JP-A-2008-121911, the place where a measurement has been made can be identified and it is easy to cope with change in the layout or change in the location of the measuring device.

However, the measuring device described in JP-A-H7 (1995)-333015 and the measuring device described in JP-A-2008-121911 are both designed to measure the air flow under the floor and in most related techniques, the air flow rate measuring device is fixed in a prescribed position of a free access floor member without an opening. These related techniques have a problem that it is impossible to measure the air flow rates in all openings by using a small number of measuring devices and changing their locations as necessary.

An object of the present invention is to provide a measuring device of air flow rate for an air conditioning system which accurately measures the flow rate of cooling air blowing out of the openings of some rectangular units and in which the locations of the openings can be changed according to the location of the equipment.

SUMMARY OF THE INVENTION

In order to achieve the above object, according to an aspect of the present invention, there is provided a measuring device of air flow rate for an air conditioning system which includes a plurality of panels constituting a floor surface, a ceiling surface, or a wall surface, a rectangular vent unit with openings being located in place of a given one of the panels, a space with a given height being formed by pillars on the back sides of the rectangular vent unit and the panels, and an air conditioner for supplying cooling air to the space. Here, cooling air from the space passes through the openings and a measuring means for measuring a flow rate of cooling air passing through the openings is located in a rib which forms the openings.

In order to achieve the above object, preferably the measuring means may measure pressures on front and back surfaces of the rectangular vent unit to calculate an air flow rate from a difference between the pressures.

In order to achieve the above object, preferably the space may be an underfloor space located on a back side of the floor surface.

In order to achieve the above object, preferably the space may be a ceiling back ventilation space located on a back side of the ceiling surface.

In order to achieve the above object, preferably the space may be a wall back ventilation space located on a back side of the wall surface.

In order to achieve the above object, preferably the measuring means may be embedded in the rib of the rectangular vent unit.

In order to achieve the above object, preferably the air flow rate obtained by the measuring means may be transmitted by a wireless transmitting means.

According to the present invention, it is possible to provide a measuring device of air flow rate for an air conditioning system which accurately measures the cooling air flowing out of openings of some of rectangular units and in which the locations of the openings can be changed according to the location of equipment.

DETAILED DESCRIPTION OF THE PREFERRED EMBODIMENTS

Next, the preferred embodiments of the present invention will be described in detail referring to the accompanying drawings.

First Embodiment

Figure 1:
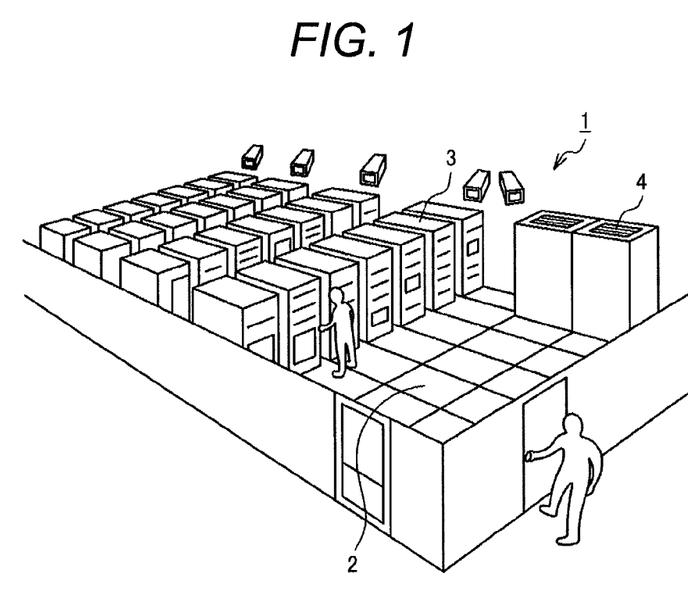
FIG. 1 schematically shows a datacenter according to the present invention.

FIG. 1 schematically shows a datacenter according to the present invention.

Figure 2:
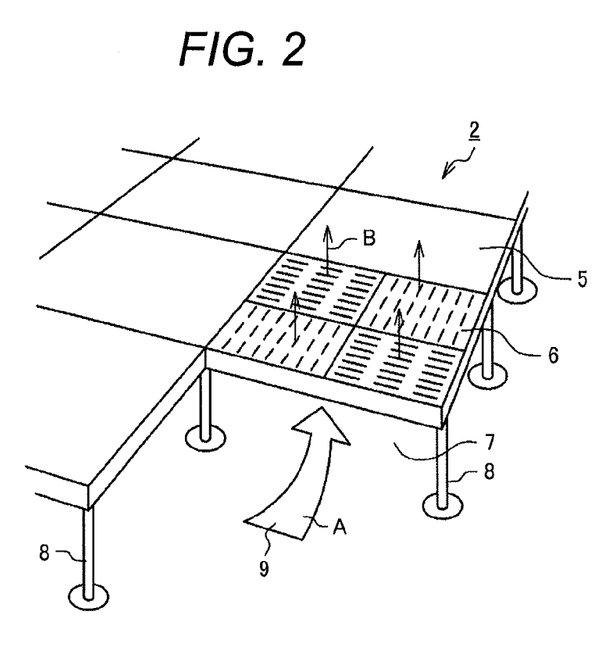
FIG. 2 is a fragmentary perspective view of an access floor according to the present invention.

FIG. 2 is a fragmentary perspective view of an access floor.

Referring to FIG. 1, many pieces of equipment 3 are installed on a floor surface 2 of a datacenter room 1. An air conditioner 4 is installed on the floor surface 2. The cooling air generated by the air conditioner 4 is discharged into the underfloor space under the floor surface 2 and then discharged to the room 1 through openings provided in part of the floor surface (which will be described in detail later), though not shown in FIG. 1. The floor surface 2 is constituted as an access floor which is constituted by approximately 500-mm square panels.

Referring to FIG. 2, the floor surface 2 which is constituted as an access floor includes a plurality of panels 5. Rectangular vent units 6 (perforated tiles) are disposed in place of some of the panels 5. An underfloor space 7 is provided under the panels 5 and rectangular vent units 6. This underfloor space 7 is formed by supporting the panels 5 and rectangular vent units 6 from under by means of pillars 8. The cooling air 9 generated by the air conditioner 4 shown in FIG. 1 and discharged into the underfloor space 7 flows in the underfloor space 7 as indicated by arrow A and discharged to the room 1 through a rectangular vent unit 6 as indicated by arrow B.

Though not shown in the figures, the cooling air 9 discharged to the room 1 is taken in by the equipment 3 installed near the rectangular vent unit 6 to cool the heat generating components in the equipment 3.

Today there is a growing demand for power saving and air conditioners in datacenters are also required to reduce power consumption. In order to cool the equipment efficiently, it is desirable to measure cooling air flow rates and install the equipment in a place where the air flow rate is the highest. Therefore, it is important to measure the flow rates of cooling air flowing out of the rectangular vent units to obtain basic information for power saving.

In the past, measurements have been made with a measuring device brought close to a rectangular vent unit. However, this approach has a problem that as mentioned above the measuring device blocks the vent and measurements cannot be made accurately.

As a solution to the problem, the present inventors considered the possibilities of embedding a measuring device in a rectangular vent unit. As a result, the inventors have come to develop embodiments as explained below.

Next, an example of a rectangular measuring unit of air flow rate according to the present invention will be explained referring to FIGS. 3 to 6.

Figure 3:
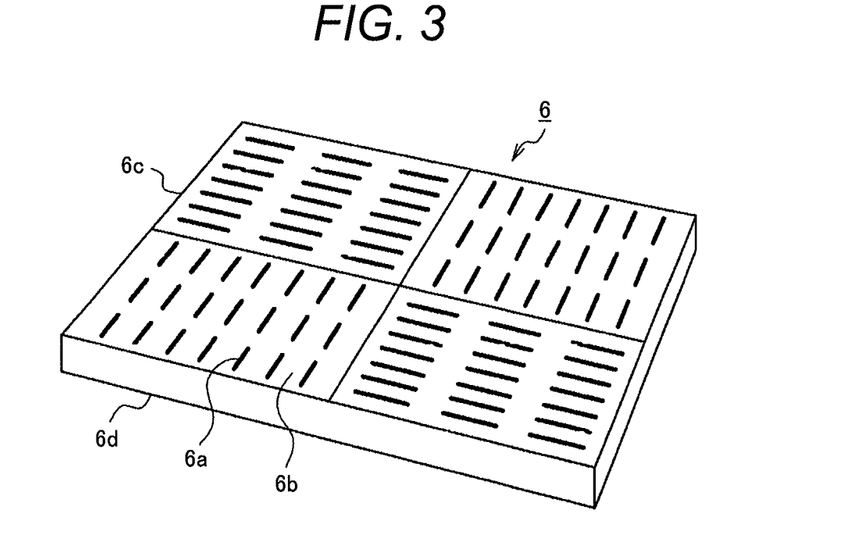
FIG. 3 is a perspective view of a rectangular vent unit according to the present invention.

FIG. 3 is a general perspective view of a rectangular vent unit.

Figure 4:
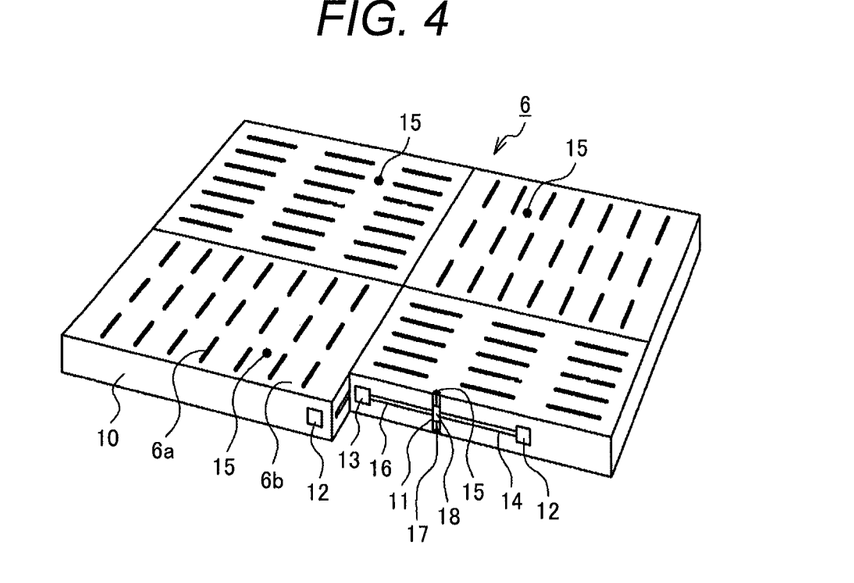
FIG. 4 is a partially cross-sectional perspective view of the rectangular vent unit shown in FIG. 3.

FIG. 4 is a partially cross-sectional perspective view of the rectangular measuring unit of air flow rate according to the present invention.

Figure 5:
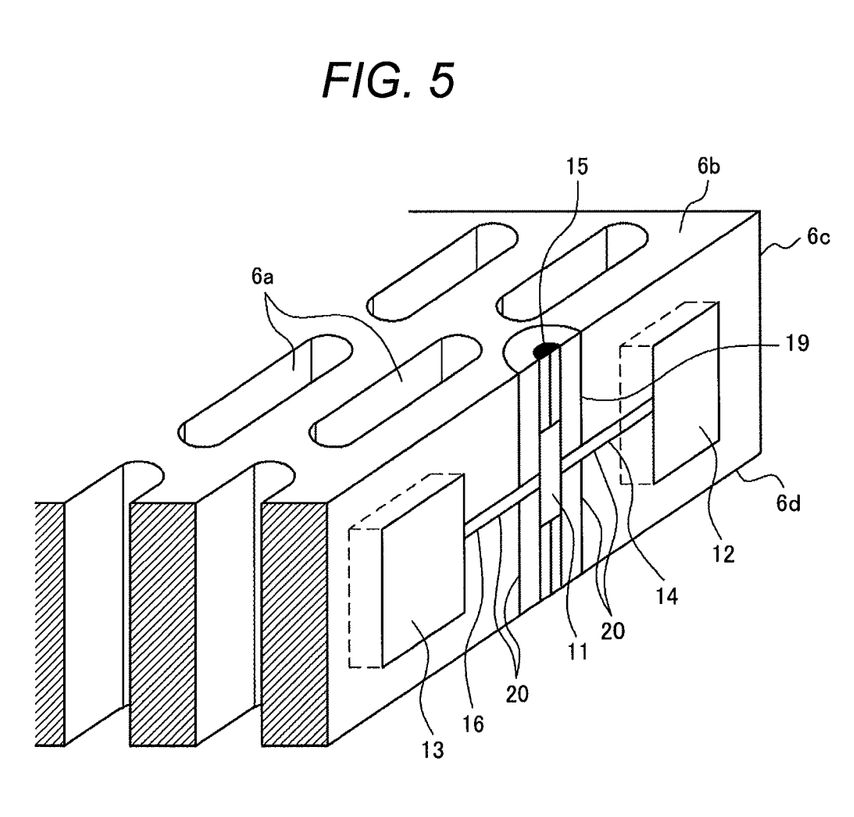
FIG. 5 is a partially cross-sectional perspective view of a rectangular measuring unit of air flow rate according to the present invention.

FIG. 5 is a partially cross-sectional perspective view of a measuring device embedded in the rectangular measuring unit of air flow rate.

Figure 6:
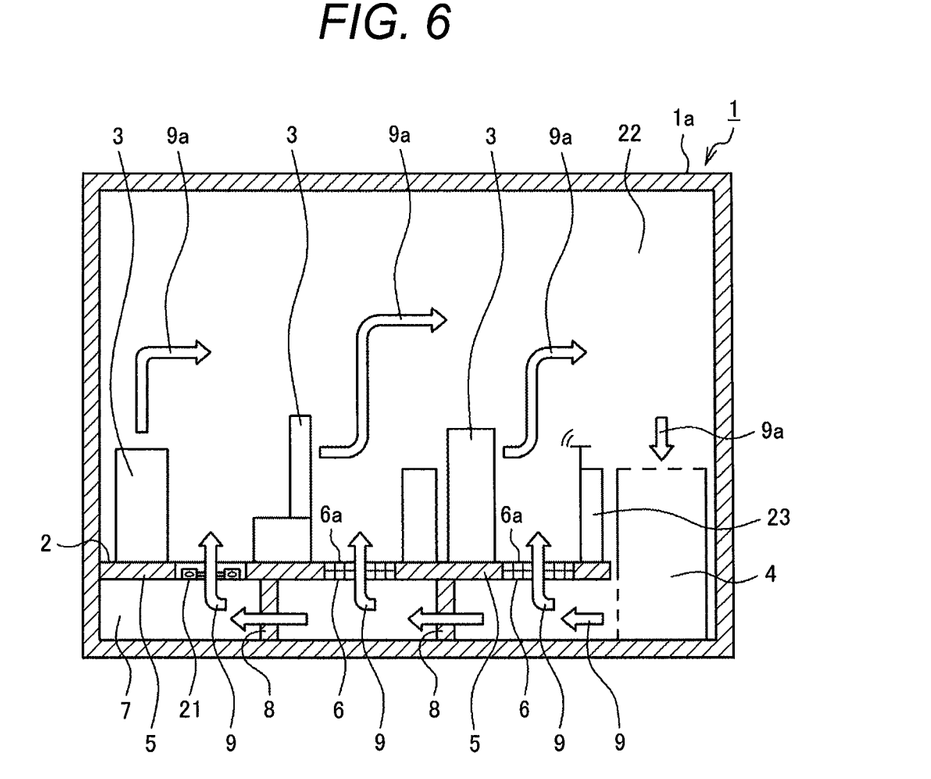
FIG. 6 is a schematic diagram showing a datacenter according to a first embodiment of the present invention.

FIG. 6 is a sectional view of a room with an air conditioning system for supplying air to the underfloor ventilation space in which a rectangular measuring unit of air flow rate is installed in the floor.

Referring to FIG. 3, the rectangular vent unit 6 has a rectangular shape with about 500 mm in width and length and about 300 mm in thickness. This rectangular vent unit 6 is a net plate which has many slits (hereinafter referred to as openings 6a). A rib 6b with a width of about 6 mm is provided between neighboring openings 6a. The side of the rectangular vent unit 6 which faces the room 1 is a front surface 6c and its side which faces the underfloor space 7 is a back surface 6d. In the rectangular vent unit 6, the openings 6a oriented in different directions are arranged asymmetrically as shown in FIG. 3, so the unit looks like a plate which is divided into quarters.

Referring to FIG. 4, the periphery of the rectangular vent unit 6 is covered by a frame 10. A pressure difference transducer 11 is embedded in a rib 6b. The pressure difference transducer 11 is connected with a battery 12 and a wireless transmitter 13 by a power cord 14.

For example, as shown in FIG. 3, the openings 6a of the rectangular vent unit 6 are made in the four quarter surfaces and thus a front surface pressure measuring point 15 should be located at four points symmetrically. Alternatively, a plurality of front surface pressure measuring points 15 may be provided in which a front surface pressure measuring point 15 is located in everyplace where the basic arrangement pattern of openings 6a in combination with ribs 6b changes.

As shown in FIG. 4, in the rectangular measuring unit of air flow rate according to the present invention, the pressure difference transducer 11, battery 12, power cord 14, wireless transmitter 13 and a cord 16 for connecting the wireless transmitter 13 and pressure difference transducer 11 are embedded in a rib 6b of the rectangular vent unit 6. Front surface pressure measuring points 15 and back surface pressure measuring points 17 are disposed on the front surface 6c and back surface 6d of the rectangular vent unit 6.

The wireless transmitter 13 and pressure difference transducer 11 use batteries 12 as power sources respectively, however, instead they may be identical if possible or they may share one battery. In addition, the wireless transmitter 13 and pressure difference transducer 11 may be integrated into one unit.

The pressure difference transducer 11 converts the pressure difference between the front surface pressure measuring point 15 and back surface pressure measuring point 17 into an electric signal and the electric signal is sent through the connecting cord 16 to the wireless transmitter 13. When pressure difference data must be adjusted according to temperature, a temperature sensor 18 is used to obtain temperature data along with the pressure difference transducer 11 and similarly the temperature data is sent to the wireless transmitter 13. However, when there is no significant temperature difference and adjustment of the pressure difference is not needed, the temperature sensor 18 is omissible. The wireless transmitter 13 transmits the received signal by a wireless transmitting means.

These measuring elements (pressure difference transducer 11, battery 12, wireless transmitter 13, power cord 14, connecting cord 16 and temperature sensor 18) are embedded in the rib 6b having a front surface pressure measuring point 15. If the rib 6b is too thin to house the pressure difference transducer 11, battery 12, power cord 14, wireless transmitter 13, and cord 16 for connecting the wireless transmitter and pressure difference transducer, they may be embedded in an adjacent panel 5 having no openings. Even in that case, the front surface pressure measuring points 15 are located at the same points of the rectangular measuring unit of air flow rate and are connected to the pressure difference transducer 11 embedded in the adjacent panel 5 by a conduit disposed in a way not to interfere with air flows through the openings 6a of the rectangular measuring unit of air flow rate.

Referring to FIG. 5, the pressure difference transducer 11 is fixed in a measuring hole 19 made in the rib 6b. In order to make a measurement accurately, the pressure difference transducer 11 is fixed by an adhesive agent 20 in a way that there are no air gaps around it. This is intended to prevent air from flowing through the measuring hole 19 between the front surface 6c and back surface 6d.

The wireless transmitter 13 and battery 12 need not always be hermetically sealed against the rib 6b of the rectangular vent unit 6. However, it is necessary to prevent air from flowing between the front surface 6c and back surface 6d of the rectangular vent unit 6 through a gap, for example, between the front surface pressure measuring point 15, power cord 14 for connecting the battery 12 and pressure difference transducer 11, or battery 12 and the surrounding rib 6b of the rectangular vent unit 6. For this reason, when burying the power cord 14 for connecting the battery 12 and pressure difference transducer 11 and the cord 16 for connecting the wireless transmitter 13 and pressure difference transducer 11, they must be completely sealed by the adhesive agent 20 so as not to produce air gaps around the power cord 14 and the data communication line.

Referring to FIG. 6, the room 1 where many pieces of equipment 3 are installed is covered by walls 1a. An air conditioner 4 is installed in the room 1 in order to cool these pieces of equipment 3. The floor surface 2 of the room 1 is constituted by panels 5 without openings and rectangular vent units 6 with openings. A plurality of rectangular vent units 6 with openings 6a are installed in place of some of the panels 5 and rectangular measuring units 21 of air flow rate are installed in place of some of the rectangular vent units 6.

The underfloor space 7 is formed under the floor surface 2. The pillars 8 support the panels 5 without openings 6a and the rectangular vent units 6 with openings 6a.

The cooling air supplied from the air conditioner 4 passes through the underfloor space 7 and flows to the room 22 through the rectangular vent units 6 or the rectangular measuring units 21 of air flow rate. A distinct feature of the present invention is that there is no difference in the flow rate of cooling air 9 supplied from the underfloor space 7 to the room 22 at a given point between when a rectangular vent unit 6a is installed at the point and when a rectangular measuring unit 21 of air flow rate is installed there.

The cooling air 9 supplied to the room 22 is sent to the equipment 3 which needs air-conditioned cooling air 9 to cool the heat generating components in the equipment 3. The air 9a which is used to cool the heat generating components and exhausted from the equipment 3 is collected by the air conditioner 4.

In this room, the pressure difference transducer 11 detects a pressure difference between the front and back surfaces of the rectangular measuring unit of air flow rate 21 which occurs when the cooling air 9 flows from the underfloor space 7 through the rectangular measuring unit of air flow rate 21 to the room inside 22. The data on the detected pressure difference is stored in an output data storage (not shown) built in the pressure difference transducer 11 and sent to the wireless transmitter 13 by the cord 16 for connecting the wireless transmitter 13 and pressure difference transducer 11. The received pressure difference data is wirelessly transmitted to a measurement data accumulation/processing unit 23 for the rectangular measuring unit of air flow rate 21 which is installed inside or outside the room.

The rectangular measuring unit of air flow rate 21 preliminarily calibrates the relation between pressure difference data obtained by the pressure difference transducer 11 and the flow rate of air passing through the rectangular measuring unit of air flow rate 21, using a blower unit which supplies air at a fixed flow rate. When a measurement is made actually, the air flow rate is calculated from a pressure difference value with reference to the relation.

Next, the calibration system used here will be described referring to FIGS. 7 and 8.

Figure 7:
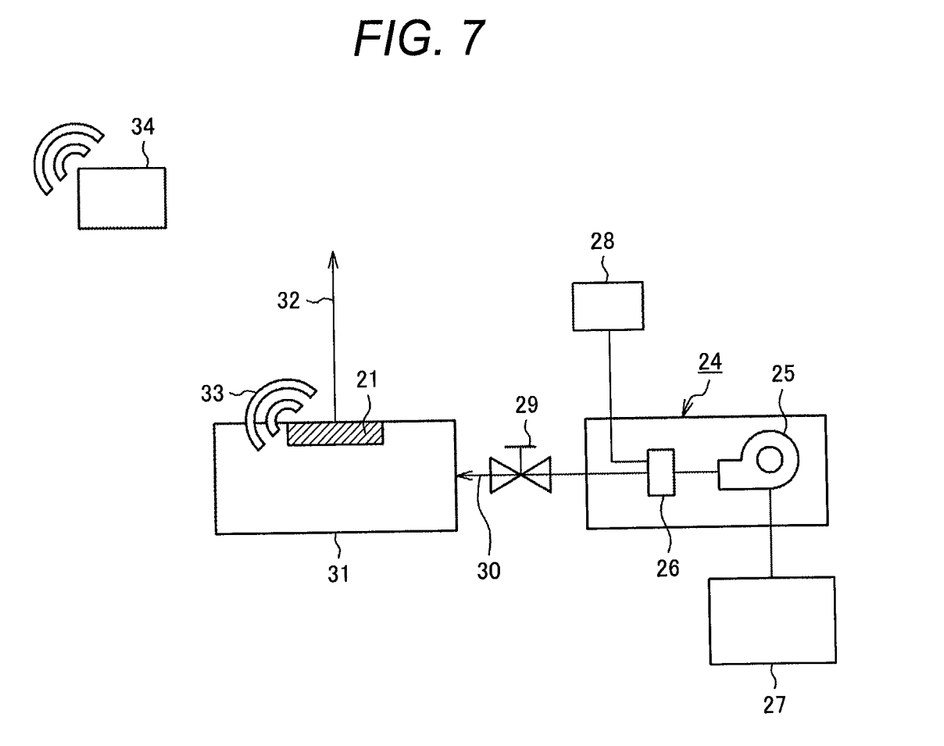
FIG. 7 is a block diagram of an air flow rate calibration system according to the first embodiment.

FIG. 7 is a block diagram of the air flow rate calibration system.

Figure 8:
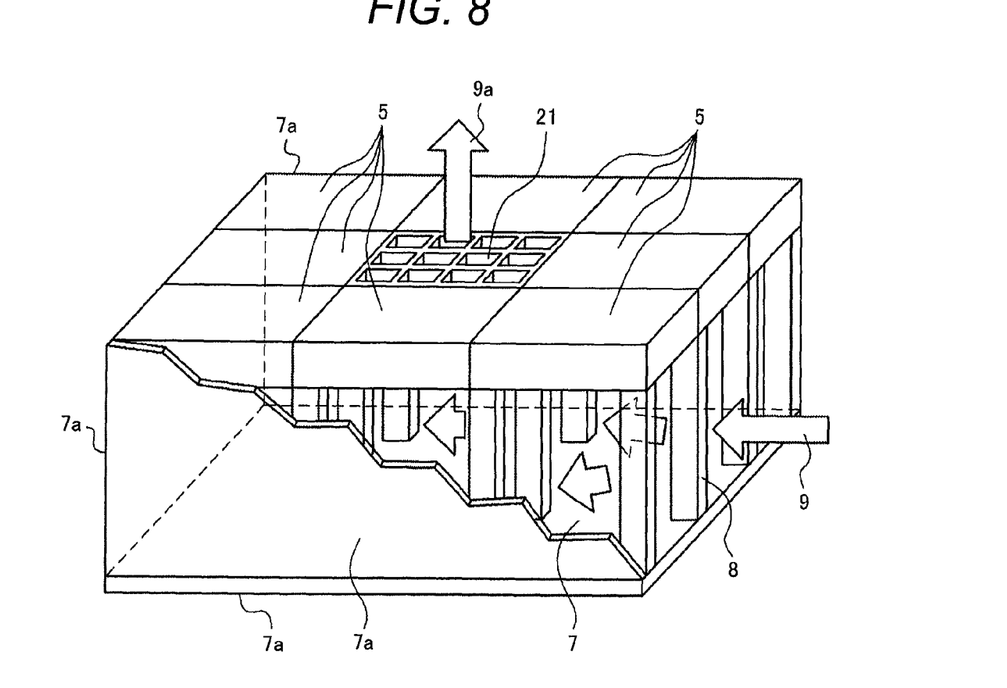
FIG. 8 is a schematic perspective view of a calibration bench for the rectangular measuring unit of air flow rate according to the first embodiment.

FIG. 8 is an outline view of a calibration bench for the rectangular measuring unit of air flow rate.

Referring to FIG. 7, a blower unit 24 incorporates a blower 25 and a measuring device 26 which measures air flow rates using an orifice or the like. An output adjusting means 27 adjusts output of the blower 25. The measuring device 26 is connected to a display unit 28 which has a function to display and record measured air flow rates. An air flow rate regulating valve 29 regulates the flow rate of air discharged from the blower unit 24. An air duct 30 guides the air from the blower unit 24 to a calibration bench 31. The rectangular measuring unit of air flow rate 21 is installed in the calibration bench 31. 33 denotes a wireless communication signal and 34 denotes a wireless data accumulation/processing means.

32 denotes a flow of air passing through the rectangular measuring unit of air flow rate 21.

According to this embodiment, the cooling air supplied by the blower unit 24 is introduced into the calibration bench 31 for the rectangular measuring unit of air flow rate 21. The calibration bench 31 is so structured as to reproduce a situation that the rectangular measuring unit of air flow rate 21 is actually used, in which the introduced cooling air blows out as an outgoing air flow 32 through the rectangular measuring unit of air flow rate 21 installed in the calibration bench 31.

Thus, there is an air flow through the rectangular measuring unit of air flow rate 21 installed in the calibration bench 31. The pressure difference, derived from the air flow, between the front surface pressure measuring point 15 and back surface pressure measuring point 17 under observation is detected and an electric signal representing the detected pressure difference is wirelessly transmitted to the external wireless data accumulation/processing means 34. The wireless data accumulation/processing means 34 converts the electric signal sent from the rectangular measuring unit of air flow rate 21 into a pressure difference value and calibrates its relation established with the flow rate of air passed through the air duct 30 which is measured by the measuring device 26.

FIG. 8 is an outline view of the calibration bench for the rectangular measuring unit of air flow rate.

Referring to FIG. 8, an underfloor space 7 is formed by pillars 8 supporting panels 5 without openings. Supply air (cooling air 9) flows in the underfloor space 7. A rectangular measuring unit of air flow rate 21 is installed in place of one of the panels 5. Guide plates 7a guide the supply air flowing in the underfloor space 7 toward the rectangular measuring unit of air flow rate 21.

In order to reproduce an actual measurement environment, this embodiment prepares a structure which simulates part of the free access floor, by supporting the panels 5 without openings by the pillars 8. Supply air (cooling air 9) is introduced from under the panels 5 without openings according to the actual measurement environment. The supply air flows out upward from the rectangular measuring unit of air flow rate 21 as indicated by arrow 9a. Also, in order to reproduce a situation that the rectangular vent unit 6 is actually used, the guide plates 7a are installed laterally and the side walls and bottom face are covered and sealed by the guide plates 7a to prevent the introduced cooling air 9 from flowing out without being passed through the rectangular measuring unit of air flow rate 21.

Due to the upward air flow from the rectangular measuring unit of air flow rate 21 (arrow 9a), a pressure difference is observed between the front surface pressure measuring point 15 (FIG. 4) and back surface pressure measuring point 17 (FIG. 4) of the rectangular measuring unit of air flow rate 21.

The flow rate of supply air (cooling air 9) is changed several times and the pressure differences between the front surface pressure measuring point 15 and back surface pressure measuring point 17 at different flow rates are detected by the rectangular measuring unit of air flow rate 21 and an electric signal representing the detection result is wirelessly transmitted to the wireless data accumulation/processing means 34 (FIG. 7), etc.

The wireless data accumulation/processing means 34 converts the electric signal into pressure difference data and stores all such data. However, conversion into pressure difference data is not always necessary; instead the electric signal may be once stored as it is and converted into pressure difference data when necessary. The relation between the pressure difference and supply air flow rate is acquired as calibration data. For example, the relation between pressure difference and air flow rate is formulated as shown in FIG. 9.

Figure 9:
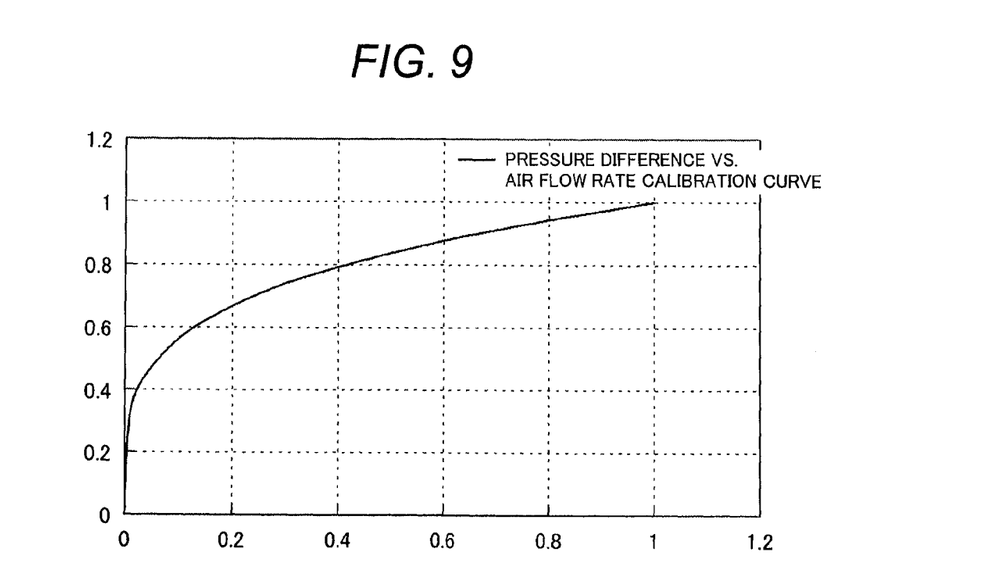
FIG. 9 is a graph which formulates the relation between pressure difference and air flow rate according to the present invention.

FIG. 9 is a graph showing a pressure difference versus air flow rate calibration curve.

In FIG. 9, the vertical axis denotes pressure difference expressed as non-dimensional data according to the full scale of measurement and the horizontal axis denotes air flow rate expressed as non-dimensional data according to the supply air flow rate.

Figure 10:
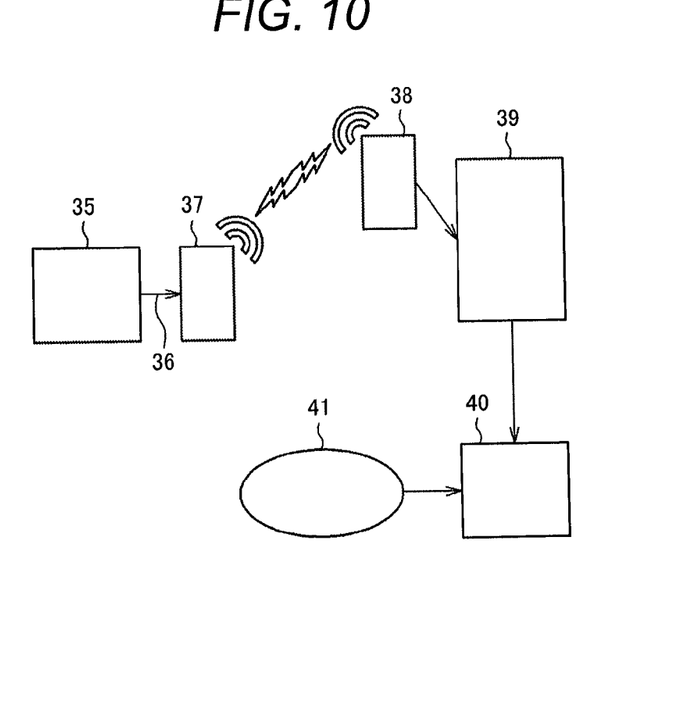
FIG. 10 is a block diagram showing reception and transmission of data according to the present invention.

FIG. 10 is a schematic diagram showing reception and transmission of data according to the first embodiment of the present invention.

Referring to FIG. 9, 35 denotes a pressure difference measuring means, 37 denotes a unit which functions as a transmitting means, 38 denotes a receiver, 39 denotes a signal demodulating means, and 40 denotes a unit which has a means for converting pressure difference data into air flow rates. 41 denotes calibration data (for example, a function and a table) which shows the relation between pressure difference and air flow rate.

In the present invention, the data obtained by the pressure difference measuring means 35 is sent as a signal 36 to the transmitting means 37 and the signal (data) sent from the transmitting means 37 is received by the receiver 38. Then, the signal is demodulated by the signal demodulating means 39 and air flow rate data is obtained by the means for converting pressure difference data into air flow rates 40.

As described above, in this embodiment, the means for converting pressure difference data into air flow rates 40 converts the data into air flow rates as shown in FIG. 10 using the previously acquired calibration data (41).

Figure 11:
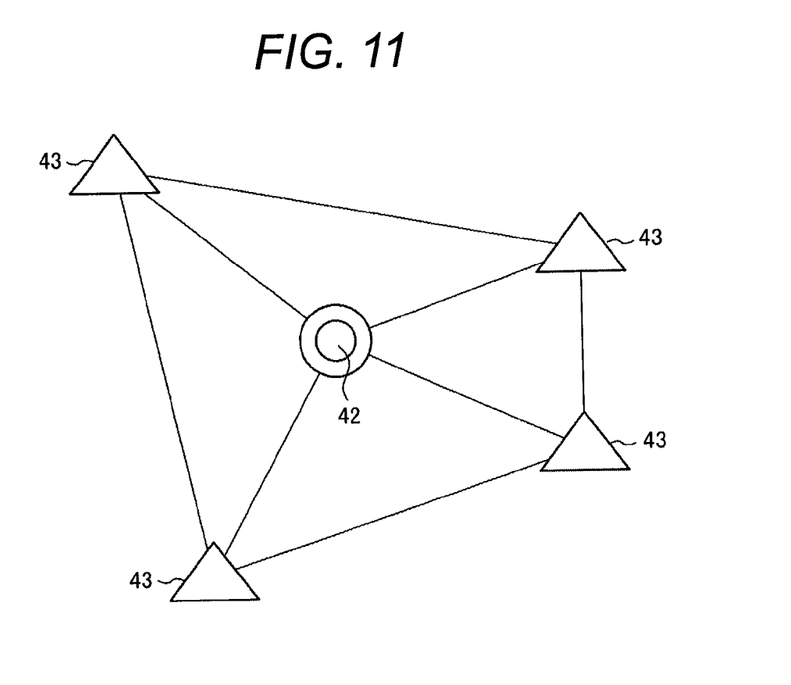
FIG. 11 is a schematic diagram for the installation and positioning of a measuring system in an air-conditioned room.

FIG. 11 is a schematic diagram for specifying the location of a measuring system in an air-conditioned room.

In FIG. 11, 42 denotes a rectangular measuring unit of air flow rate and 43 denotes previously established reference points.

In this embodiment, three or more measuring devices may be installed in the room and their locations may be identified by data dependent on positional relation, such as intensities of received signals. In this embodiment, the size of the measuring device is not limited as far as it meets the specification of the rectangular unit model.

In addition, in this embodiment, a color different from an ordinary color is used for painting. The rectangular vent unit may partially have a unique appearance such as a convexo-concave pattern so that it is distinguishable from an ordinary air vent and visually recognizable as a point at which measurements are made for air conditioning. Wire connection may be adopted for an external device which requires measurement data unless wires are an obstacle.

Second Embodiment

Figure 12:
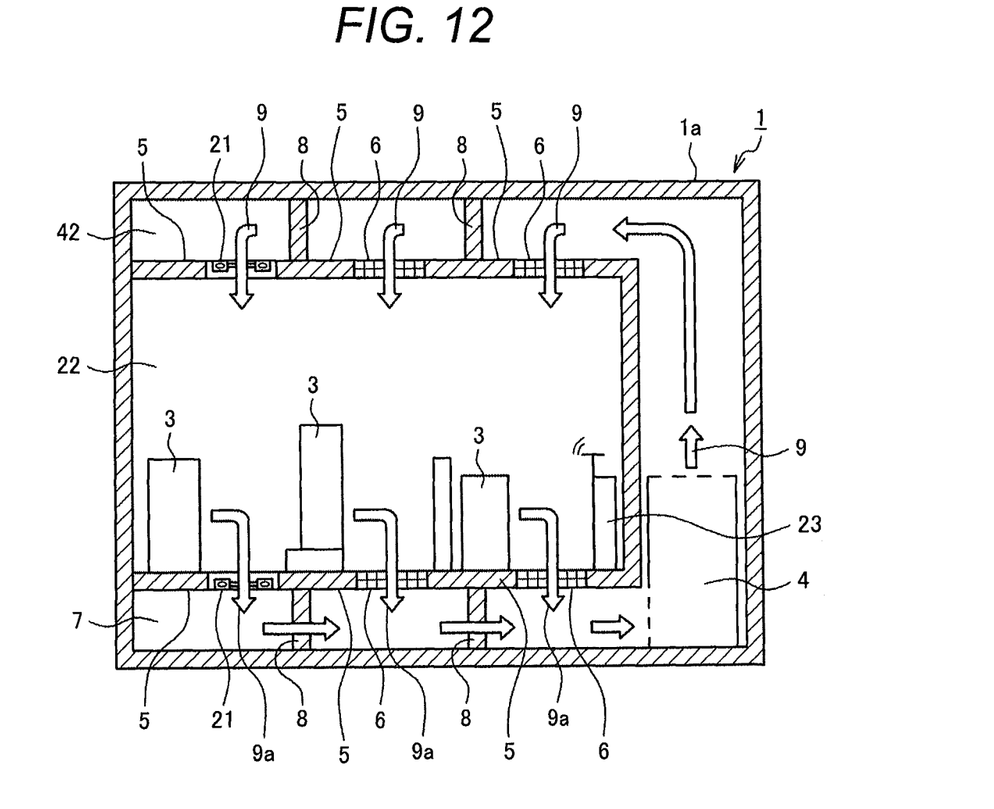
FIG. 12 is a schematic diagram showing a datacenter according to a second embodiment of the present invention.

FIG. 12 is a sectional view of a room where a rectangular measuring unit of air flow rate according to the second embodiment is installed.

Referring to FIG. 12, 4 denotes an air conditioner, 6 a rectangular vent unit, 21 a rectangular measuring unit of air flow rate, 42 a ceiling back ventilation space, 5 a panel without openings, 8 a pillar supporting a panel 5, 2 a room inside, 7 an underfloor space, and 1a an outer shell of the room 1.

The second embodiment is largely different from the first embodiment in that whereas the cooling air 9 generated by the air conditioner 4 is supplied to the underfloor space 7 to measure the flow rate of cooling air flowing out of the underfloor space 7 to the room inside 22 in the first embodiment, the cooling air 9 is supplied to the ceiling back ventilation space 42 in the second embodiment.

Specifically, the air-conditioned cooling air 9 supplied from the air conditioner 4 flows in the ceiling back ventilation space 42 and goes through a rectangular vent unit 6 or a rectangular measuring unit of air flow rate 20 to the room inside 22. Here, a distinct feature of the present invention is that there is no difference in the flow rate of the cooling air 9 supplied from the underfloor space 7 to the room inside 22 at a given point between when a rectangular vent unit 6 is installed at the point and when a rectangular measuring unit of air flow rate 21 is installed there.

The cooling air 9 supplied to the room inside 22 is sent to the equipment 3 which must be cooled and the cooling air 9 used inside the equipment for cooling is collected by the air conditioner 4 as indicated by the arrows shown in the underfloor space 7 to serve as cooling air 9 again.

In the room inside 22 where the equipment 3 is installed, the pressure difference transducer 11 detects a pressure difference between the front and back surfaces of the rectangular measuring unit of air flow rate 21 which occurs when the cooling air 9 supplied to the ceiling back ventilation space 42 passes through the rectangular measuring unit of air flow rate 21. The data on the pressure difference detected by the pressure difference transducer 11 is stored in an output data storage (not shown) and sent to the wireless transmitter 13 by the connecting cord 16 before being wirelessly transmitted to a measurement data accumulation/processing unit 23 for the rectangular measuring unit of air flow rate 21 which is installed inside or outside the room.

As described above, according to the second embodiment, even when the room is a double-walled structure with a ceiling back ventilation space 42, cooling air 9 can be supplied to the equipment. The location of the rectangular measuring unit of air flow rate 21 can be changed according to the location of the equipment 3, so a datacenter with a high cooling efficiency can be designed.

Third Embodiment

Figure 13:
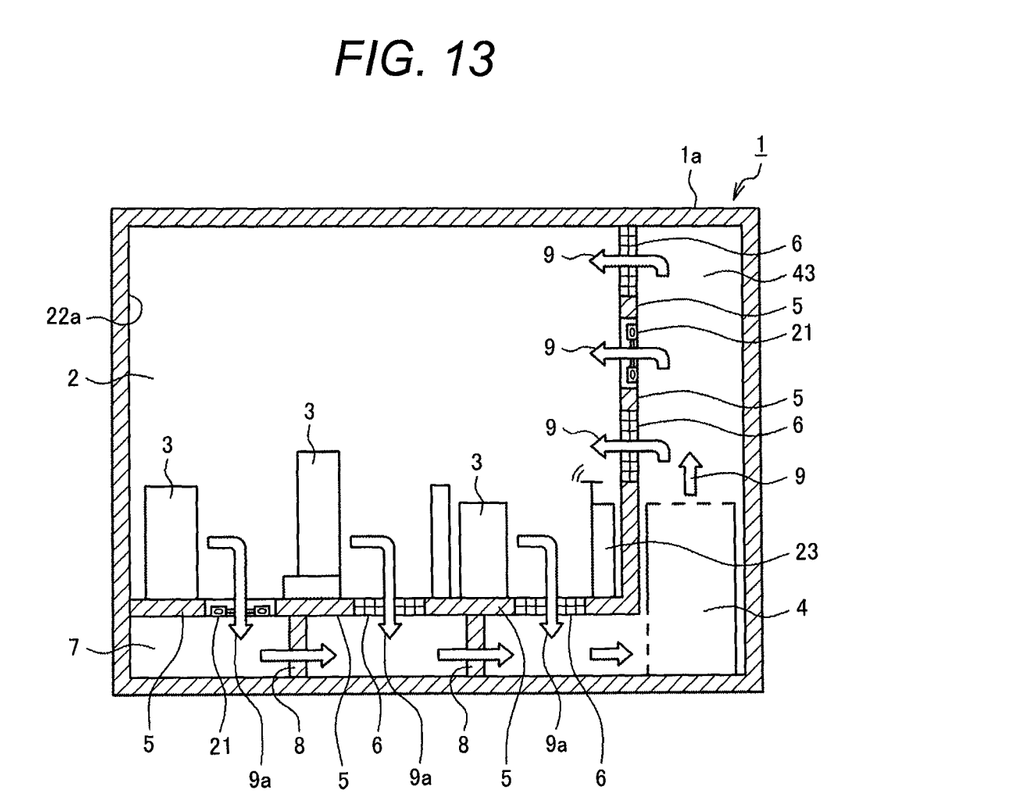
FIG. 13 is a schematic diagram showing a datacenter according to a third embodiment of the present invention.

FIG. 13 is a sectional view of a room where a rectangular measuring unit of air flow rate according to the third embodiment is installed.

Referring to FIG. 13, 4 denotes an air conditioner, 6 a rectangular vent unit, 21 a rectangular measuring unit of air flow rate, 43 a wall back ventilation space, 5 a panel without openings, 8 a pillar supporting a panel 5, 2 a room inside, 7 an underfloor ventilation space, 1a an outer shell of the room, and 22a a wall surface in the room.

The third embodiment is largely different from the first and second embodiments in the following aspects. In the first embodiment, the cooling air 9 generated by the air conditioner 4 is supplied to the underfloor space 7 to measure the flow rate of cooling air flowing from the underfloor space 7 to the room inside 22. In the second embodiment, the cooling air 9 is supplied to the ceiling back ventilation space 42. On the other hand, in this embodiment, the cooling air 9 is supplied to the wall back ventilation space 43.

Specifically, the air-conditioned cooling air 9 supplied from the air conditioner 4 flows in the wall back ventilation space 43 and goes through a rectangular vent unit 6 or a rectangular measuring unit of air flow rate 21 to the room inside 22. Here, a distinct feature of the present invention is that there is no difference in the flow rate of the cooling air 9 supplied from the underfloor space 7 to the room inside 22 at a given point between when a rectangular vent unit 6 is installed at the point and when a rectangular measuring unit of air flow rate 21 is installed there.

The cooling air 9 supplied to the room inside 22 is sent to the equipment 3 which must be cooled and the cooling air 9 used inside the equipment for cooling is collected by the air conditioner 4 as indicated by the arrows shown in the underfloor space 7 to serve as cooling air 9 again.

In the room inside 22 where the equipment 3 is installed, the pressure difference transducer 11 detects a pressure difference between the front and back surfaces of the rectangular measuring unit of air flow rate 21 which occurs when the cooling air 9 supplied to the wall back ventilation space 43 passes through the rectangular measuring unit of air flow rate 21. The data on the pressure difference detected by the pressure difference transducer 11 is stored in an output data storage (not shown) and sent to the wireless transmitter 13 by the connecting cord 16 before being wirelessly transmitted to a measurement data accumulation/processing unit 23 for the rectangular measuring unit of air flow rate 21 which is installed inside or outside the room.

As described above, according to this embodiment, the flow rate of air passing through a unit with openings can be calculated with reference to the relation between pressure drop and flow rate in the unit and the flow direction can be calculated based on the sign of pressure difference. The unit may be implemented by including a means for converting pressure difference into an electric signal, a means for transmitting measurement results to a receiver by a wireless transmission method capable of identifying each of data signals from plural units, and a power source for driving these means such as a battery in a way that fluid loss when the rectangular measuring unit of air flow rate 21 is employed is equivalent to fluid loss when the rectangular vent unit 6 is employed.

As discussed so far, according to the present invention, since the shape of the rectangular measuring unit of air flow rate is equivalent to that of the rectangular unit with openings, when one or more than one of the rectangular units constituting the floor, ceiling or wall is (are) replaced by one or more than one unit with openings, the flow rate and flow direction can be measured accurately. After measurements have been made, the supply air flow rate is unchanged even after the rectangular measuring unit of air flow rate is replaced by a rectangular unit with openings, so when measurements are to be made at a plurality of points, the rectangular measuring unit of air flow rate can be freely moved from one measuring point to another. In addition, the rectangular measuring unit of air flow rate according to the present invention can be installed anywhere in place of a rectangular unit without the need for wire connection and where it is installed can be known at a remote location. Therefore, when the room layout is changed, it is easy to change and adjust the locations of openings according to the destination of ventilation air or the object which takes in the air for efficient air ventilation.

What is claimed is:

1. A measuring device of air flow rate for an air conditioning system, comprising:
   a plurality of panels constituting a floor surface, a ceiling surface, or a wall surface;
   a rectangular vent unit with openings being located in place of a given one of the panels;
   a space with a given height being formed by pillars on back sides of the rectangular vent unit and the panels; and
   an air conditioner for supplying cooling air to the space,
   wherein cooling air from the space passes through the openings; and
   wherein a measuring unit for measuring a flow rate of cooling air passing through the openings is located in a rib which forms the openings.

2. The measuring device of air flow rate for an air conditioning system according to claim 1, wherein the measuring unit measures pressures on front and back surfaces of the rectangular vent unit to calculate an air flow rate from a difference between the pressures.

3. The measuring device of air flow rate for an air conditioning system according to claim 1, wherein the space is an underfloor space located on a back side of the floor surface.

4. The measuring device of air flow rate for an air conditioning system according to claim 1, wherein the space is a ceiling back ventilation space located on a back side of the ceiling surface.

5. The measuring device of air flow rate for an air conditioning system according to claim 1, wherein the space is a wall back ventilation space located on a back side of the wall surface.

6. The measuring device of air flow rate for an air conditioning system according to claim 1, wherein the measuring unit is embedded in the rib of the rectangular vent unit.

7. The measuring device of air flow rate for an air conditioning system according to claim 1, wherein the air flow rate obtained by the measuring unit is transmitted by a wireless transmitting unit.

* * * * *